United States Patent
Hou

(10) Patent No.: US 10,130,010 B2
(45) Date of Patent: Nov. 13, 2018

(54) INTERNAL HEAT-DISSIPATION TERMINAL

(71) Applicant: ZTE Corporation, Shenzhen, Guangdong (CN)

(72) Inventor: Fangxi Hou, Shenzhen (CN)

(73) Assignee: ZTE CORPORATION, Shenzhen (CN)

( * ) Notice: Subject to any disclaimer, the term of this patent is extended or adjusted under 35 U.S.C. 154(b) by 0 days.

(21) Appl. No.: 14/787,057

(22) PCT Filed: Aug. 19, 2013

(86) PCT No.: PCT/CN2013/081804
§ 371 (c)(1),
(2) Date: Dec. 2, 2015

(87) PCT Pub. No.: WO2013/189373
PCT Pub. Date: Dec. 27, 2013

(65) Prior Publication Data
US 2016/0106002 A1    Apr. 14, 2016

(30) Foreign Application Priority Data

Apr. 27, 2013 (CN) .......................... 2013 2 0224042

(51) Int. Cl.
*H05K 7/20* (2006.01)
*H05K 1/02* (2006.01)

(52) U.S. Cl.
CPC ....... *H05K 7/20436* (2013.01); *H05K 1/0203* (2013.01); *H05K 2201/2018* (2013.01)

(58) Field of Classification Search
CPC .. H05K 1/0203–1/0204; H05K 1/0272; H05K 1/0207; H05K 1/02–1/0201;
(Continued)

(56) References Cited

U.S. PATENT DOCUMENTS 5,075,759 A * 12/1991 Moline ................... H01L 23/66
257/692
6,341,062 B1    1/2002 Patel
(Continued)

FOREIGN PATENT DOCUMENTS

CN         1458561 A    11/2003
CN         1458562 A    11/2003
(Continued)

OTHER PUBLICATIONS

International Search Report in international application No. PCT/CN2013/081804, dated Feb. 13, 2014.
(Continued)

*Primary Examiner* — Dion R Ferguson
*Assistant Examiner* — Amir Jalali
(74) *Attorney, Agent, or Firm* — Oppedahl Patent Law Firm LLC

(57) ABSTRACT

The disclosure provides an internal heat-dissipation terminal, wherein the terminal comprises at least one cavity in which heat-storage material is arranged. The cavity is located in an area without a device in the terminal. The technical solution of the disclosure can be applied to substantially enhance the heat storage capability of the terminal.

3 Claims, 2 Drawing Sheets

(58) Field of Classification Search
CPC .. H05K 1/0212; H05K 3/0061; H05K 7/2029; H05K 2201/10416; H05K 2201/066; H05K 2201/064; H01L 2023/4062
USPC ......... 361/700, 720–722, 715–717; 257/706; 174/252
See application file for complete search history.

(56) References Cited

U.S. PATENT DOCUMENTS

| | | | |
|---|---|---|---|
| 6,478,228 B1* | 11/2002 | Ikefuji | G06K 19/07728 235/441 |
| 6,719,206 B1* | 4/2004 | Bashan | G06K 19/07747 235/492 |
| 2002/0158722 A1* | 10/2002 | Maruhashi | H01P 5/185 333/246 |
| 2002/0189853 A1* | 12/2002 | Hsu | H01L 23/3677 174/252 |
| 2003/0024633 A1* | 2/2003 | Ogura | H01L 23/66 156/250 |
| 2004/0120121 A1* | 6/2004 | Barcley | H01L 23/3677 361/720 |
| 2005/0063162 A1* | 3/2005 | Barcley | H05K 1/0206 361/720 |
| 2006/0292722 A1* | 12/2006 | Becker | H05K 1/0204 438/28 |
| 2009/0145637 A1 | 6/2009 | Kanouda | |
| 2009/0185352 A1* | 7/2009 | Ellsworth | H05K 1/0204 361/720 |
| 2010/0006994 A1* | 1/2010 | Shim, II | H01L 21/561 257/676 |
| 2010/0190464 A1* | 7/2010 | Chen | H01L 23/04 455/334 |
| 2010/0327068 A1* | 12/2010 | Chen | G06K 19/07749 235/492 |
| 2011/0011939 A1* | 1/2011 | Seah | G06K 19/07749 235/492 |
| 2011/0149519 A1* | 6/2011 | Choudhury | H05K 1/0236 361/707 |
| 2011/0163348 A1* | 7/2011 | Lin | H05K 1/021 257/99 |
| 2012/0018522 A1* | 1/2012 | Le Garrec | G06K 19/07749 235/492 |
| 2012/0037710 A1* | 2/2012 | Le Garrec | G06K 7/10178 235/492 |
| 2012/0057303 A1 | 3/2012 | Tsai | |
| 2012/0061127 A1* | 3/2012 | Fields | H01L 23/373 174/252 |
| 2012/0061476 A1* | 3/2012 | Le Garrec | G06K 19/077 235/492 |
| 2012/0212384 A1* | 8/2012 | Kam | H01Q 1/2283 343/767 |
| 2012/0250260 A1 | 10/2012 | Burton | |
| 2013/0207274 A1* | 8/2013 | Liu | H01L 23/66 257/774 |

FOREIGN PATENT DOCUMENTS

| | | |
|---|---|---|
| CN | 1592566 A | 3/2005 |
| CN | 1599549 A | 3/2005 |
| CN | 2770284 Y | 4/2006 |
| CN | 1878452 A | 12/2006 |
| CN | 101707859 A | 5/2010 |
| CN | 101770563 A | 7/2010 |
| CN | 201709079 U | 1/2011 |
| CN | 202009411 U | 10/2011 |
| EP | 1103170 A1 * | 5/2001 |
| EP | 2355628 A1 | 8/2011 |
| EP | 2506113 A2 | 10/2012 |
| WO | 0008903 A1 | 2/2000 |

OTHER PUBLICATIONS

English Translation of the Written Opinion of the International Search Authority in international application No. PCT/CN2013/081804, dated Feb. 13, 2014.
Supplementary European Search Report in European application No. 13807715.1, dated Apr. 26, 2016.

* cited by examiner

INTERNAL HEAT-DISSIPATION TERMINAL

TECHNICAL FIELD

The disclosure relates to the terminal heat-dissipation technology, and in particular to an internal heat-dissipation terminal.

BACKGROUND

With the development of electronic device technologies and mobile Internet, functions and performances of terminals become increasingly powerful, and thus the power consumption and heat productivity of various chips in the terminal also become increasingly high. Therefore, the heat dissipation problem of terminals must be solved or mitigated.

In the conventional technologies, there are two heat dissipation methods for terminals. One of the methods is directly adding heat dissipation material on heating chips in the terminal to accelerate outward heat transfer; or connecting low-temperature parts with high-temperature parts via heat dissipation material to accelerate heat balance, thereby lowering the temperature of local hot spots. However, with this method, when the overall heat of the terminal is balanced, the temperature will increase to an upper limit in a short time. As a result, in order to reduce the heat of the whole terminal, the running speed of the terminal has to be reduced or some functions have to cease. Another of the methods is adding an air-convection or liquid-convection device into the terminal to balance heat dissipation. However, this kind of method is difficult to implement in the case of a limited terminal space.

SUMMARY

In view of this, the disclosure is intended to provide an internal heat-dissipation terminal, with which the heat storage capability of the terminal can be substantially enhanced.

To this end, the technical solutions of the disclosure are implemented as follows.

An embodiment of the disclosure provides an internal heat-dissipation terminal, wherein the terminal includes at least one cavity in which heat-storage material is arranged;

the cavity is located in an area without a device in the terminal.

In the above solution, the cavity is formed by an area without a device surrounded by a shield frame which is arranged in the terminal; and/or the cavity is formed by an area without a device surrounded by devices in the terminal.

In the above solution, the shield frame has an enclosed structure; the shield frame and the area surrounded by the shield frame are located in an area without a device on a Printed Circuit Board (PCB) of the terminal.

In the above solution, the enclosed structure is formed by at least one of the following structures: a hemispherical enclosed structure and a polyhedral enclosed structure.

In the above solution, the shield frame is made of metal and/or metallic alloy and/or non-metallic material.

In the above solution, the cavity is formed by an area without a device surrounded by the PCB and an antenna bracket in the terminal.

In the above solution, the heat-storage material is insulated heat-storage material and/or non-insulated heat-storage material.

In the above solution, when the cavity is formed by an area without a device surrounded by a shield frame which is arranged in the terminal, the heat-storage material arranged in the cavity is insulated heat-storage material and/or non-insulated heat-storage material;

when the cavity is formed by an area without a device surrounded by devices in the terminal, the heat-storage material arranged in the cavity is insulated heat-storage material.

The internal heat-dissipation terminal provided by the embodiment of the disclosure includes at least one cavity in which heat-storage material is arranged, and the cavity is located in an area without a device in the terminal. In this case, the idle space in the terminal can be substantially used as a cavity to accommodate heat-storage material, and thus a great amount of heat-storage material can be arranged in the terminal, so as to substantially enhance the heat-storage capability of the terminal.

DETAILED DESCRIPTION

In order to assist in understanding technical characteristics and features of embodiments of the disclosure in more details, the embodiments of the disclosure are described in details below in conjunction with accompanying drawings, which are only intended to illustrate but not to limit the embodiments of the disclosure.

Figure 1:
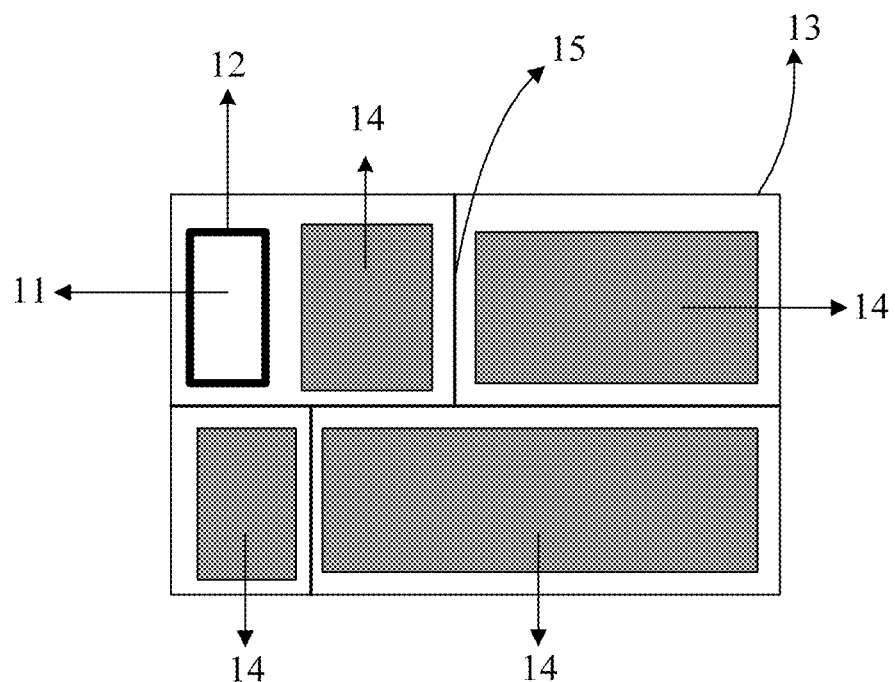
FIG. 1 shows a structure diagram 1 of a terminal with internal heat-dissipation function according to an embodiment of the disclosure.

FIG. 1 shows a structure diagram 1 of a terminal with internal heat-dissipation function according to the embodiment of the disclosure. As shown in FIG. 1, the terminal with internal heat-dissipation function includes at least one cavity 11 in which heat-storage material is arranged, and the cavity 11 is located in an area without a device in the terminal.

In particular, as shown in FIG. 1, a plurality of devices 14 are arranged on a PCB 13 in the terminal. The devices 14 are isolated from each other by a first shield frame 15. An area without a device in the terminal is the left upper area on the PCB 13. Here, the first shield frame 15 is used for preventing generation of interference between the devices 14. Any structure would be sufficient for the first shield frame 15, as long as the interference can be shielded. In the embodiment of the disclosure, the area without a device is designed as an enclosed cavity 11, and heat-storage material is arranged in the cavity 11 to absorb the heat generated by the devices 14 on the PCB 13.

Preferably, the cavity 11 is formed by the area without a device surrounded by a shield frame 12 which is arranged in the terminal.

The shield frame 12 has an enclosed structure; the shield frame 12 and the area surrounded by the shield frame 12 are located in the area without a device on the PCB 13 of the terminal.

In particular, as shown in FIG. 1, the shield frame 12 is a rectangular structure, and the shield frame 12 and the area surrounded by the shield frame 12 are located in the area without a device on the left upper part of the PCB 13 of the terminal. The area surrounded by the shield frame 12 is the designed cavity 11.

Preferably, the enclosed structure may be a hemispherical enclosed structure, a polyhedral enclosed structure and the like. Here, the enclosed structure is used to guarantee the heat-storage material in the cavity 11 to be isolated from other devices 14, and thus the normal operation of the devices 14 will not be affected.

Here, the material of the shield frame 12 may be metal and/or metallic alloy and/or non-metallic material.

Preferably, the shield frame 12 and the first shield frame 15 may be made of the same material, or may be made of different materials. Preferably, when manufacturing the PCB 13, the shield frame 12 and the first shield frame 15 may be integrated on the PCB 13 by using the same material; then, the heat-storage material may be arranged inside the cavity 11 within the shield frame 12.

In the above solution, since the shield frame 12 is an enclosed structure, the area surrounded by the shield frame 12 is isolated from the devices on the PCB 13. In this way, the heat-storage material inside the cavity 11 is prevented from contacting the devices 14 on the PCB 13. Therefore, the heat-storage material inside the cavity 11 may be insulated material and/or non-insulated material.

In the above solution, the heat-storage material may be phase-change heat-storage material, such as polycrystalline silicon.

Figure 2:
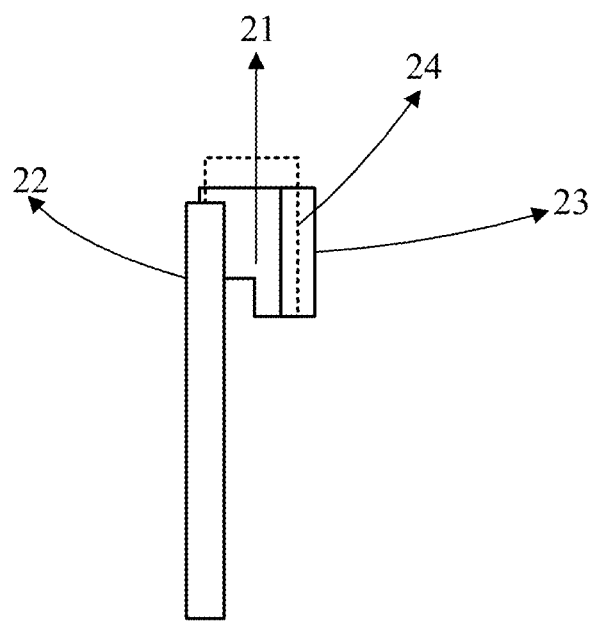
FIG. 2 shows a structure diagram 2 of a terminal with internal heat-dissipation function according to an embodiment of the disclosure.

FIG. 2 shows a structure diagram 2 of a terminal with internal heat-dissipation function according to an embodiment of the disclosure. As shown in FIG. 2, the terminal with internal heat-dissipation function includes at least one cavity 21 in which heat storage material is arranged; and the cavity 21 is located in an area without a device in the terminal.

Preferably, the cavity 21 is located in an area without a device between a PCB 22 and an antenna 23 in the terminal.

In particular, an avoidance space reserved when designing the antenna serves as the cavity 21. As shown in FIG. 2, the antenna 23 is fixed at a position away from the PCB 22 by a bracket 24. In this way, an area without a device exists between the PCB 22 and the antenna 23. The area without a device is the cavity 21. Heat-storage material is arranged inside the cavity 21 to absorb the heat generated by devices on the PCB 23.

In this embodiment, the bracket 24 is intended to prolong the distance between the antenna 23 and the PCB 22, so as to prevent the devices on the PCB 22 from affecting operation of the antenna 23. The area without a device between the antenna 23 and the PCB 22 forms the cavity 21, and thus the heat-storage material inside the cavity 21 will have no influence on the devices on the PCB 22. The heat-storage material absorbs and stores heat from the PCB 22 to lower the temperature of the PCB 22, thereby enabling the devices on the PCB 22 to operate normally.

Figure 3:
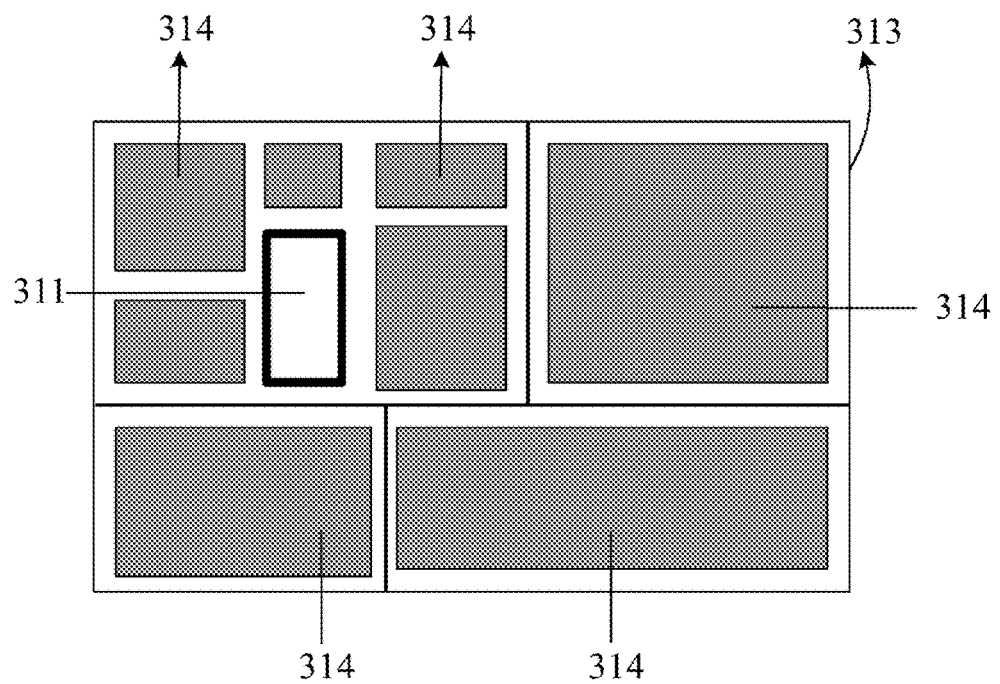
FIG. 3 shows a structure diagram of a terminal with internal heat-dissipation function according to an embodiment of the disclosure.

FIG. 3 shows a structure diagram of a terminal with internal heat-dissipation function according to an embodiment of the disclosure. As shown in FIG. 3, the terminal with internal heat-dissipation function includes at least one cavity 311 in which heat-storage material is arranged, and the cavity 311 is located in an area without a device in the terminal. In particular, a plurality of devices 314 are arranged on a PCB 313 in the terminal. Preferably, the cavity 311 is formed by the area without a device surrounded by devices 314 in the terminal. The heat-storage material and the devices 314 in the terminal are arranged in the same plane.

In the above solution, the heat-storage material may be phase-change heat-storage material, such as polycrystalline silicon, and the heat-storage material is insulated material. Therefore, interference between the heat-storage material and the antenna can be avoided.

The terminals with internal heat-dissipation function provided by the embodiments of the disclosure make full use of the idle space in the terminal, and make the idle space a cavity capable of accommodating heat-storage material, and thus more heat-storage materials can be added into the cavity. When the terminal is operating, the heat-storage capability of the terminal is substantially improved, and the time of duration of the terminal operating with high performance is prolonged.

What described above are only preferred embodiments of the disclosure, and are not intended to limit the scope of protection of the disclosure.

INDUSTRIAL APPLICABILITY

The internal heat-dissipation terminal provided by in the disclosure includes at least one cavity in which heat-storage material is arranged. The cavity is located in an area without a device in the terminal. In this way, the idle space in the terminal can be substantially used as a cavity to accommodate heat-storage material, and thus a great amount of heat-storage material can be arranged in the terminal, so as to substantially enhance the heat-storage capability of the terminal.

What is claimed is:

1. An internal heat-dissipation terminal, wherein the terminal comprises at least one cavity in which a heat-storage material is arranged;
    the cavity is located in an area without a device, which is surrounded by a PCB and an antenna bracket in the terminal,
    the cavity is formed by an area without a device, which is surrounded by devices in the terminal, and
    the heat-storage material and the devices in the terminal are arranged in the same plane.

2. The internal heat-dissipation terminal according to claim 1, wherein the heat-storage material is insulated heat-storage material.

3. The internal heat-dissipation terminal according to claim 1, wherein the heat-storage material is non-insulated heat-storage material.

* * * * *